(12) United States Patent
Kuchiyama et al.

(10) Patent No.: US 8,895,427 B2
(45) Date of Patent: Nov. 25, 2014

(54) SUBSTRATE HAVING A TRANSPARENT ELECTRODE AND METHOD FOR PRODUCING THE SAME

(75) Inventors: Takashi Kuchiyama, Settsu (JP); Kenji Yamamoto, Kobe (JP)

(73) Assignee: Kaneka Corporation, Osaka (JP)

( * ) Notice: Subject to any disclaimer, the term of this patent is extended or adjusted under 35 U.S.C. 154(b) by 428 days.

(21) Appl. No.: 13/061,943

(22) PCT Filed: Aug. 26, 2009

(86) PCT No.: PCT/JP2009/064863
§ 371 (c)(1),
(2), (4) Date: Mar. 2, 2011

(87) PCT Pub. No.: WO2010/026899
PCT Pub. Date: Mar. 11, 2010

(65) Prior Publication Data
US 2011/0163448 A1    Jul. 7, 2011

(30) Foreign Application Priority Data

Sep. 4, 2008  (JP) ................... 2008-227184
Sep. 30, 2008 (JP) ................... 2008-254123
Jan. 20, 2009 (JP) ................... 2009-010318
Mar. 31, 2009 (JP) ................... 2009-086022

(51) Int. Cl.
*H01L 21/44*    (2006.01)

(52) U.S. Cl.
USPC ........................................ 438/609; 438/608

(58) Field of Classification Search
USPC ............... 257/749, E23.155; 438/608, 609
See application file for complete search history.

(56) References Cited

U.S. PATENT DOCUMENTS 5,458,753 A    10/1995  Sato et al.
5,736,267 A    4/1998   Mitsui et al.
6,146,765 A    11/2000  Mitsui et al.
7,247,551 B2 *  7/2007  Higuchi et al. ............ 438/607
8,043,955 B1 * 10/2011  Feldman-Peabody ........ 438/609
2008/0237760 A1 * 10/2008 Kawashima et al. ........ 257/431

FOREIGN PATENT DOCUMENTS

EP    0 578 046 A1   1/1994
JP    61205619 A     9/1986
JP    S61263008 A   11/1986

(Continued)

OTHER PUBLICATIONS

ISA The International Bureau of WIPO, International Preliminary Report on Patentability, Apr. 21, 2011, 9 pages.
ISA Japanese Patent Office, International Search Report of PCT/JP2009/064863, Dec. 1, 2009, 4 pages.
Sawada, Yutaka, "Transparent Electroconductive Film (Tomeidodenmaku)," Issued by CMC Publishing Inc., Mar. 1, 1999, pp. 16-19, 8 pages.

(Continued)

*Primary Examiner* — Hung Vu
(74) *Attorney, Agent, or Firm* — Alleman Hall McCoy Russell & Tuttle LLP

(57) ABSTRACT

A zinc oxide transparent electroconductive oxide has been difficult to use as a substrate having a transparent electrode because the oxide, when configured as a thin film, because of increased resistivity due to air and/or moisture exposure. Though doping can inhibit increase of resistance to some extent, there has been difficulty in selecting a type and an amount of a doping substance and because doping causes high initial resistance. A substrate having a transparent electrode with stable resistivity against various environments is produced by a magnetron sputtering method using a target composed of a zinc oxide transparent electroconductive oxide containing 0.50 to 2.75% silicon dioxide by weight relative to the oxide.

8 Claims, 2 Drawing Sheets

(56) References Cited

FOREIGN PATENT DOCUMENTS

| JP | 62-154411 A | 7/1987 |
|---|---|---|
| JP | 06-187833 | 7/1994 |
| JP | 07249316 A | 9/1995 |
| JP | 07-288049 | 10/1995 |
| JP | 08-045352 | 2/1996 |
| JP | 08-111123 | 4/1996 |
| JP | 08-209338 | 8/1996 |
| JP | 08-287725 | 11/1996 |
| JP | 10-237630 | 9/1998 |
| JP | 2001-039712 A | 2/2001 |
| JP | 2002-075061 A | 3/2002 |
| JP | 2002-075062 A | 3/2002 |
| JP | 2002-217429 A | 8/2002 |

OTHER PUBLICATIONS

Martins, R. et al., "Role of order and disorder on the electronic perfomances of oxide semconductor thin film transistors," Journal of Applied Physics 101.1 (2007), 8 pages.

Asamaki, Tatsuo, "Basic of Thin Film Formation (Hakumakukeisei-no-Kiso)," Issued by the Nikkan Kogyo Shinbun Ltd. (Business & Technology Daily News), Jul. 25, 2005, pp. 221-224, 4 pages.

Ishibashi S. et al., "Low resistivity indium-tin oxide transparent conductive files. II. Effect of sputtering voltage on electrical property of films," J. Vac. Sci. Technol. A. vol. 8, No. 3, May/Jun. 1990, pp. 1403-1406, 4 pages.

\* cited by examiner (EXAMPLE 1)

(EXAMPLE 2)

(COMPARATIVE EXAMPLE 2)

SUBSTRATE HAVING A TRANSPARENT ELECTRODE AND METHOD FOR PRODUCING THE SAME

TECHNICAL FIELD

The present invention relates to a substrate having a transparent electrode that achieves high stability in the presence of environmental variability (endurance) and to a method for producing the same, the substrate being mainly used in a field such as a touch panel, a plasma display panel (PDP), a liquid crystal display (LCD), an electroluminescence (EL) display, a transparent electrode and a back electrode of a solar cell, a transparent interlayer of a hybrid solar cell, a low-dielectric-constant film used for a high-speed electron compound semiconductor device, a surface acoustic wave element, a window glass coating for infrared cutoff, a gas sensor, a prism sheet using nonlinear optics, a transparent magnetic body, an optical recording element, an optical switch, an optical waveguide, an optical splitter, an optoacoustic material, and a high-temperature heating material.

BACKGROUND ART

A substrate having a transparent electrode that is used for a device such as a touch panel, a display, or a solar cell widely uses a compound such as indium tin oxide (ITO), tin oxide, or zinc oxide as a transparent electroconductive layer. It is known that such a transparent electroconductive layer may be formed not only by a physical vapor deposition method (PVD method), such as a magnetron sputtering method, a molecular beam epitaxy method, and/or a chemical vapor deposition method (CVD method), such as a thermal CVD method or a plasma CVD method, but also by an electroless method.

ITO excels among transparent electroconductive materials, and recently has been widely used in a transparent electroconductive layer. However, because of the possibility of depletion of the raw material indium, a search for alternative materials to ITO has resulted, which requires urgent attention to both resources and costs.

Zinc oxide (ZnO) may be put forth as an example of transparent electroconductive materials alternative to ITO. It is said that ZnO is more transparent but is lower in water and heat stability than ITO (see Nonpatent Document 1 specified below).

Patent Documents 1 and 2, specified below, describe that a transparent electrode containing ZnO combined with chrome or cobalt and group III or group IV atoms has good etching characteristics.

On the other hand, Patent Document 3, specified below, describes that a transparent electroconductive body formed by lamination of a hard-coat layer on a plastic base and further lamination of a transparent electroconductive layer on the hard-coat layer, the transparent electroconductive layer being composed mainly of zinc oxide doped with 4 to 6 atom % silicon, has a favorable sheet resistance stability (i.e., a small change of resistance in reliability tests). However, the transparent electroconductive body described in Patent Document 3 may have lower electrical conductivity because it contains about 5 atom % silicon. In contrast, reduction of the silicon content to improve the electrical conductivity results in decreased stability. Further, it is reported that improved chemical stability may be achieved with a protective film is provided by treating a surface of a zinc oxide transparent electroconductive oxide with an aqueous solution containing triad cations (see Patent Document 4 specified below).

Zinc oxide is a compound having a high ionic property, and among thin-film materials is thus sensitive to water or chemicals. A first approach to compensate for such weakness is to intercept water by a covering layer formed on a surface of a zinc oxide transparent thin film. Materials such as metals or polyolefins can generally function as water barriers, but most of them may be ill-suited for use with a substrate having a transparent electrode because they are nontransparent materials or insulators. A second approach to provide stability is by doping the zinc oxide. In the descriptions of Patent Documents 1 to 3, doping with a substance such as cobalt, chrome, and silicon can improve stability.

These approaches can be applied by a method, such as film-formation, after mixing zinc oxide with another metal oxide or a metal chloride, or by another method, such as co-sputtering zinc oxide with silicon dioxide. Further, JP H10-237630 A (Patent Document 5, specified below) describes a way to form a transparent electroconductive layer by a sputtering method using a metal target in a carbon-containing gas, such as carbon dioxide. However, productivity problems may arise with this approach because the zinc metal used as the metal target may be easily oxidized, causing poor stability of the target's composition.

JP S62-154411 A (Patent Document 6, specified below) discloses a transparent electroconductive film composed mainly of zinc oxide and containing group IV elements, such as silicon. Patent Document 6 relates to the same application as JP H5-6766 B, which is described in Paragraph [0004] in Patent Document 3. The transparent electroconductive film relating to Patent Document 6 is disadvantageous in that electrical conductivity of the electroconductive film is decreased if left in a high temperature and high humidity environment because of age instability of an electric resistance value, which is specified in the paragraphs [0005] to [0007] in the Patent Documents 3. Herein, in an embodiment in Patent Document 6, a film-formation is performed at a power density of 2 $W/cm^2$ in the case of sputtering.

JP 2002-217429 A (Patent Document 7, specified below) reports on zinc oxide doped with aluminum, gallium, boron, or indium in addition to silicon in relation to a translucent electroconductive film used in a photoelectric conversion element. However, although the translucent electroconductive film is formed by sputtering, a target used for the sputtering contains more than two kinds of elements other than oxygen. Such a target requires very difficult processes to mix uniformly and to sinter, causing production and/or productivity problems as the area of the target increases.

As described above, although application of ZnO alternatives to ITO to a transparent electroconductive layer has been widely developed, a material superior to the now-commonly used ITO has not been put sufficiently to practical use.

Much discussion has been made over chemical stability, including supposition that oxygen attachment to a crystal grain boundary prevents charge transfer between crystal particles. Elimination of crystal grain boundaries by making amorphous zinc oxide supposedly improves chemical stability. However, zinc oxide is a compound having good crystallinity, and thus, an electroconductive and amorphous zinc oxide transparent electroconductive oxide has rarely been reported, except for IZO, containing indium oxide (Nonpatent Document 2, specified below). However, IZO contains zinc oxide of only about 10 atom % and is composed mainly of indium oxide. As described, an amorphous zinc oxide transparent electroconductive oxide composed mainly of abundant zinc oxide has not been found yet. The Nonpatent Documents 3 and 4, specified below, are documents generally related to sputtering.

Patent Documents
Patent Document 1: JP 2002-75061 A
Patent Document 2: JP 2002-75062 A
Patent Document 3: JP H8-45352 A
Patent Document 4: JP 2001-39712 A
Patent Document 5: JP H10-237630 A
Patent Document 6: JP S62-154411 A
Patent Document 7: JP 2002-217429 A
Nonpatent Documents
Nonpatent Document 1: "Tomeidodenmaku" ("Transparent Electroconductive Film") edited by Mr. Yutaka Sawada, pp. 6-19, 1999, issued by CMC Publishing, Inc.
Nonpatent Document 2: R. Martins, J. Appl. Phys., 101. 1, 2007
Nonpatent Document 3: "Hakumakukeisei-no-Kiso ($4^{th}$ edition)" ("Basic of Thin Film Formation") authored by Mr. Tatsuo Asamaki, pp. 221-224, 2005, issued by The Nikkan Kogyo Shinbun Ltd. (Business & Technology Daily News)
Nonpatent Document 4: S. Ishibashi et al., J. Vac. Sci. Technol. A. Vol. 8, No. 3 May/June, pp. 1403-1406, 1990

SUMMARY OF INVENTION

Technical Problem

In view of the above-mentioned current situations, it is a problem to be solved by the present invention to improve stability of a zinc oxide transparent electroconductive oxide when the oxide is left in a high temperature and high humidity environment.

Solution to Problem

In order to solve the above-mentioned problem, the present inventors found that addition of a small amount of silicon atoms to zinc oxide in a zinc oxide transparent electroconductive layer reduces lost electroconductivity and improves durability against environmental variability.

An aspect of the present invention therefore has the following configuration.

A substrate having a transparent electrode includes a base and at least one transparent electroconductive oxide layer composed mainly of zinc oxide and formed on the base, wherein the at least one transparent electroconductive oxide layer is composed of a transparent electroconductive oxide containing 0.50 to 2.75% silicon dioxide by weight relative to zinc oxide, and having a peak amplitude ratio $I_{LO}/I_{TO}$ of 0.40 or more, when $I_{LO}$ and $I_{TO}$ represent, respectively, peak amplitudes in a longitudinal optical (LO) mode (in the vicinity of 570 to 575 $cm^{-1}$) and a transverse optical (TO) mode (in the vicinity of 380 to 385 $cm^{-1}$), both modes being A1-symmetrical optical vibration modes detected by a laser Raman spectrometry.

The laser Raman spectrometry in the present aspect is carried out by directing a laser beam perpendicular to a surface of the transparent electrode. In the A1-symmetrical optical vibration modes shown in the present aspect, a vibration mode parallel to the laser beam is a longitudinal optical (LO) mode, while a vibration mode perpendicular to the laser beam is a transverse optical (TO) mode.

The oxide, containing silicon dioxide in the above-mentioned range and having a peak amplitude ratio $I_{LO}/I_{TO}$ of 0.40 or more, brings about good sheet resistance stability in a high temperature and high humidity environment. With a $I_{LO}/I_{TO}$ ratio of less than 0.40, the stability in high temperature and high humidity is reduced. Also with less than 0.50% silicon dioxide by weight, the stability in high temperature and high humidity is reduced, and with more than 2.75% silicon dioxide by weight, the electroconductivity is reduced.

Though the reason why the peak amplitude ratio $I_{LO}/I_{TO}$ relates to stability in high temperature and high humidity in the present invention has not been entirely clarified, it is attributed to two effects of "an influence of lattice distortion" and "inhibition of carrier transfer to a surface of a transparent electrode by an influence of an electron-phonon interaction." The former effect is inferred because stability is improved because closely arranged crystal grains due to crystal distortion and accompanying inner stress keep water and/or oxygen from entering into a layer. The latter effect is inferred because an amount of carrier (electron) transfer to the surface of the transparent electrode is reduced due to the LO phonon having a strong interaction with electrons, and thus the carrier is prevented from being trapped by water and/or oxygen.

The transparent electroconductive oxide preferably has a peak amplitude ratio $I_{LO}/I_{TO}$ of 1.80 or less. That is because ratios beyond this value render production difficult. Further, too large of a peak amplitude ratio may possibly reduce durability.

The substrate has a surface, which has a first sheet resistance (R0) immediately after the substrate is formed and a second sheet resistance (R1) after the substrate is left at 85 degrees centigrade and 85% relative humidity for 10 days, a ratio (R1/R0) of the second sheet resistance (R1) to the first sheet resistance (R0) being preferably 0.75 to 1.5.

Another aspect of the present invention has the following configuration.

A substrate having a transparent electrode includes a base and at least one transparent electroconductive oxide layer composed mainly of zinc oxide and formed on the base, wherein the at least one transparent electroconductive oxide layer is composed of a transparent electroconductive oxide containing 0.50 to 2.75% silicon dioxide by weight relative to zinc oxide, the substrate further having a surface, wherein the surface has a first sheet resistance (R0) immediately after the substrate is formed and a second sheet resistance (R1) after the substrate is left at 85 degrees centigrade and 85% relative humidity for 10 days, a ratio (R1/R0) of the second sheet resistance to the first sheet resistance being 0.75 to 1.5.

Such a transparent electroconductive film is formed at a higher power density in the film formation than a predetermined value. Conventionally, it has been considered that a sputtering film formation at a higher power density may decrease film quality because $O^-$ ions generated adjacent to a target cause selective resputtering (etching) of a film after the film formation (see the Nonpatent Documents 3 and 4). However, the present inventors found that increasing a power density during film formation of the zinc oxide transparent electroconductive oxide forms a film having excellent stability. This is attributed to the fact that a region in the vicinity of a crystal grain boundary becomes an amorphous-like, which inhibits attachment of oxygen and/or water onto the crystal grain boundary and disturbance of electric conduction.

A method for producing a substrate having a transparent electrode is therefore as follows.

A method for producing any of the substrates described above is performed in such a manner that the transparent electroconductive oxide layer is formed by a magnetron sputtering method using a mixture of zinc oxide and 0.50 to 2.75% silicon dioxide by weight relative to the zinc oxide as a sputtering target and applying a power density of 3.5 $W/cm^2$ or more to the target during the sputtering film formation.

A power density of less than 3.5 $W/cm^2$ decreases the peak amplitude ratio $I_{LO}/I_{TO}$, resulting in reduced stability.

The magnetron sputtering method preferably applies a power of 18 W/cm² or less in density to the target in the sputtering film formation so as to prevent possible inexpediences, described below, resulting from an over power density.

Still another aspect of the present invention has the following configuration.

A substrate having a transparent electrode includes a base and a transparent electroconductive oxide layer composed mainly of zinc oxide and formed on the base, wherein the transparent electroconductive oxide layer is composed of a mixed oxide containing zinc oxide and at least one oxide selected from a group consisting of gallium oxide, aluminum oxide, and boron oxide, and having a peak amplitude ratio $I_{LO}/I_{TT}$ of 1.40 or more, when $I_{LO}$ and $I_{TO}$ represent respectively peak amplitudes in a longitudinal optical (LO) mode (in the range of 570 to 575 cm$^{-1}$) and a transverse optical (TO) mode (in the range of 380 to 385 cm$^{-1}$), both modes being A1-symmetrical optical vibration modes detected by a laser Raman spectrometry.

The mixed oxide having a ratio $I_{LO}/I_{TO}$ of 1.40 or more has a favorable sheet resistance stability in high temperature and high humidity. A mixed oxide having less than a ratio $I_{LO}/I_{TO}$ of 1.40 has a comparatively lower stability in high temperature and high humidity.

The mixed oxide preferably has a peak amplitude ratio $I_{LO}/I_{TO}$ of 2.20 or less, because a ratio beyond this value renders production difficult. Further, too large of a peak amplitude ratio may reduce stability.

Yet another aspect of the present invention has the following configuration.

A substrate having a transparent electrode includes a base and a transparent electroconductive oxide layer composed mainly of zinc oxide and formed on the base, wherein the transparent electroconductive oxide layer is composed of a mixed oxide including zinc oxide and at least one oxide selected from a group consisting of gallium oxide, aluminum oxide, and boron oxide, and the substrate satisfying the following two formulae, with D (nm) representing a film thickness of the transparent electroconductive oxide layer, Sa (nm) representing Surface Average Roughness measured with an atomic force microscope, and Sds (μm$^{-2}$) representing Density of Summits of the Surface:

$$Sa \leq 0.01 \times D + 4.0$$

$$Sds \geq -0.55 \times D + 420$$

In this aspect, the substrate has a surface, which has a first sheet resistance (R0) immediately after the substrate is formed and a second sheet resistance (R1) after the substrate is left at 85 degrees centigrade and 85% relative humidity for 10 days, a ratio (R1/R0) of the second sheet resistance (R1) to the first sheet resistance (R0) preferably being 2.0 or less.

A method for producing any of the substrates in the above-mentioned aspects is as follows.

A method for producing any of the substrates in the above-mentioned aspects is performed in such a manner that the transparent electroconductive oxide layer is formed by a magnetron sputtering method using a mixed oxide of zinc oxide and at least one oxide selected from a group consisting of gallium oxide, aluminum oxide, and boron oxide as a sputtering target and applying power density of 6.0 W/cm² or more to the target in the sputtering film formation.

A power density of less than 6.0 W/cm² decreases the peak amplitude ratio $I_{LO}/I_{TO}$, resulting in reduced stability.

The magnetron sputtering method preferably applies a power density of 18 W/cm² or less to the target in the sputtering film formation so as to prevent possible inexpediences, described below, resulting from too great a power density.

Advantageous Effect of Invention

The present invention improves durability of a transparent electroconductive oxide composed mainly of zinc oxide, thereby forming a substrate having a transparent electrode that provides excellent characteristics in "electroconductivity" and "durability against environmental variability," which are important characteristics especially for a device such as a touch panel, electroluminescence electrode substrate, and a solar cell.

The present invention can use a transparent electroconductive oxide composed mainly of zinc oxide without indium, other than impurity, thereby utilizing abundant zinc oxide.

DESCRIPTION OF EMBODIMENTS

Figure 1:
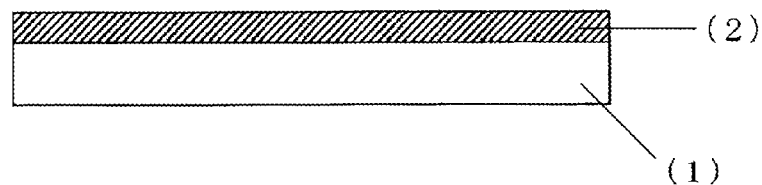
FIG. 1 is an explanatory diagram of a cross-section of a substrate having a transparent electrode of the present invention.

Now, major embodiments of a substrate having a transparent electrode of the present invention will be described in detail below, making reference to the accompanying drawings. FIG. 1 is a view showing a schematic cross section of a substrate having a transparent electrode of the present invention. A zinc oxide transparent electroconductive oxide layer 2 is formed on a base 1 (FIG. 1). The layer 2 is composed of a zinc oxide transparent electroconductive oxide composed mainly of zinc oxide without indium, other than impurity.

The base 1 may be made of any material, which is selected depending on the intended use and is not particularly limited to either a hard or a soft material, so long as it is transparent at least within a visible light range when being used as a base of a transparent electrode. Glass or sapphire can be used as the hard material. Specifically, glass includes alkali glass, borosilicate glass, and alkali-free glass.

The base made of glass or sapphire may have a thickness discretionarily selected depending on the intended use, but preferably has a thickness within a range of 0.5 mm to 4.5 mm, as an example in view of a balance of handleablity and weight. Too thin a material might be insufficient in strength, resulting in being breakable by impact. In contrast, too thick a material becomes heavy in weight and affects a thickness of a device, rendering application to a portable device difficult, and further being unfavorable in view of transparency and cost.

On the other hand, a thermoplastic resin or a thermohardening resin can be used as the soft material. The thermoplastic resin includes acrylate resin, polyester, polycarbonate resin, polyolefin, and cycloolefin polymer (COP). The thermohardening resin includes polyurethane. A base composed mainly of COP, which has superior optical isotropy and barrier properties against water, is preferable among these.

COP includes norbornene polymer, olefin-norbornene copolymer, and unsaturated alicyclic hydrocarbon polymer, such as cyclopentadiene. In view of water barrier properties, it is preferable that a main chain and a side chain of a constituent molecule exclude functional groups with high polarity, such as carbonyl groups and hydroxyl groups.

Further, in view of excellent heat-resisting properties, polyethylene naphthalate (PEN) or polyethersulfone (PES) can be used.

The base made of a soft material, such as resin, may have a thickness discretionarily selected depending on the intended use, but is easy to handle in thickness in a range of about 0.03 mm to 3.0 mm. Too thin a material may be difficult to handle and insufficient in strength. In contrast, too thick a material may have problems of transparency and cost, and may increase device thickness, rendering application to a portable device difficult. It is preferable to have a shape of a film or a sheet having a thickness of 0.03 mm to 1.0 mm, and more preferable to have a thickness of 0.035 mm to 0.5 mm.

When a film is used as the base 1, the base film can be stretched so as to be provided with a phase difference, which enables production of a low-reflection panel by combination with a polarization plate, thereby creating expectations for great improvement in visibility of pictures.

A phase difference can be provided by a known method, such as a stretching treatment including a uniaxial or biaxial stretching and an orientation treatment. At this time, exposing of the film to a temperature approaching a glass-transition temperature facilitates orientation of a polymer backbone. A retardation value is, though dependent on the intended function, preferably within a range of 50 to 300 nm so as to provide an anti-reflective function, and more preferably is about 137 nm, which is a quarter of a wavelength at about 550 nm, at which light is light recognized most strongly by human beings.

When the substrate having a transparent electrode is used as an interlayer of a solar cell or an EL device, the zinc oxide transparent electroconductive oxide of the present invention can be deposited on the base, such as a photoelectric conversion layer and an emission layer. The photoelectric conversion layer in this case can be composed of amorphous or crystalline silicon or a multi-element compound semiconductor. The emission layer can be composed of metallo-organic complex containing a central metal atom, such as an aluminum atom and a rare-earth atom.

Embodiments of the zinc oxide transparent electroconductive oxide layer 2 of the present invention are roughly divided into two types: one with added silicon dioxide and one with added gallium oxide, aluminum oxide, or boron oxide. These embodiments will be individually described in detail below.

(An Oxide Layer Added with Silicon Dioxide)

A zinc oxide transparent electroconductive oxide layer 2 in an embodiment of the present invention is characterized in containing 0.50 to 2.75% silicon dioxide by weight relative to zinc oxide, preferably 0.8 to 2.2% by weight, and more preferably 0.8 to 2.1% by weight. Although the role of silicon dioxide has not been defined, it is assumed that silicon dioxide is eccentrically located in the vicinity of a crystal grain boundary of zinc oxide without reducing its electro conductivity, thereby inhibiting carrier scattering, electrolytically generated by attachment of oxygen or moisture in the vicinity of the crystal grain boundary. Preferably, the oxide layer in this embodiment substantially excludes dopants other than silicon, such as aluminum, gallium, boron, and indium.

A small amount of added silicon dioxide causes decreased stability against environmental variability. The above-mentioned assumption explains that it is because silicon dioxide is insufficiently eccentrically-located in the vicinity of the crystal grain boundary of zinc oxide so as to inhibit carrier scattering in the boundary. Meanwhile, a large amount of added silicon dioxide causes significantly decreased electroconductivity, rendering the oxide layer difficult to function as a substrate for a transparent electrode. The above-mentioned assumption indicates that too much silicon dioxide enlarges segregation of silicon dioxide in the vicinity of the crystal grain boundary of zinc oxide, making carrier transfer between crystal grains of zinc oxide difficult.

The transparent electroconductive oxide layer 2 of the present invention is formed by a magnetron sputtering method. A target used for the magnetron sputtering method is prepared by sintering a mixed oxide containing an oxide, composed mainly of zinc oxide and silicon dioxide, and bonding the resulting oxide to a backing plate by means such as hot pressing. The silicon dioxide to be mixed is preferably about 0.50 to 2.75% by weight relative to the zinc oxide, and more preferably about 0.8 to 2.2% by weight.

The magnetron sputtering method is performed using a power source, such as a DC power source and a high-frequency power source (RF, VHF). The substrate in the present invention is produced at a power density of 3.5 W/cm$^2$ or more, and further at 4 W/cm$^2$ or more during sputtering. The power density is preferably of 4 W/cm$^2$ to 18 W/cm$^2$, more preferably of 4.5 W/cm$^2$ to 15 W/cm$^2$, and most preferably of 5 W/cm$^2$ to 13 W/cm$^2$.

Such a range of the power density achieves the film formation of the transparent electroconductive oxide layer having the peak amplitude ratio described above. In a case of a power density less than the above-mentioned range, it may fail to improve a film formation speed and often exhibits lower reliability in high temperature and high humidity, though that is thought to be due to crystal defects. In contrast, in a case of a power density higher than the above-mentioned range, the transparent electroconductive oxide layer undergoes resputtering by oxygen ions generated in plasma, whereby the substrate may have unfavorably decreased transparency and electroconductivity. The present invention can determine an optimum condition for the film formation by appropriately controlling conditions such as a target/substrate distance and a temperature of a substrate, so as to reduce damage to the substrate.

Laser Raman measurement is carried out using a helium-neon laser beam having an excitation light wavelength of 632.8 nm. Zinc oxide has peak positions detected in the ranges of 570 to 575 cm$^{-1}$ and 380 to 385 cm$^{-1}$, respectively, in response to vibrations of LO and TO modes, which are A1-symmetrical optical vibrations. Herein, the peak position may slightly move, but in this case, it is only necessary to employ a value of a maximum peak position in the vicinity of the peak position. When peak amplitudes of these are represented, respectively, as $I_{LO}$ and $I_{TO}$, a peak amplitude ratio $I_{LO}/I_{TO}$ preferably shows 0.40 to 1.80, and more preferably 0.45 to 1.65. As described above, the film formation is performed preferably at a power density of 3.5 W/cm$^2$ or more. In a case where the formation is performed at power densities in the ranges of 4.5 W/cm$^2$ to 15 W/cm$^2$ and 5 W/cm$^2$ to 13 W/cm$^2$, transparent electroconductive films having a ratio $I_{LO}/I_{TO}$ of 0.65 to 1.80 and 0.70 to 1.65, respectively, are obtained. It is desirable that the resulting films have stable sheet resistances.

Such a range of value forms a substrate having a transparent electrode with excellent durability against environmental variability.

Because these peak amplitudes are attributed mainly to lattice vibrations and/or lattice defects within a transparent electroconductive oxide layer, the lattice vibrations and the lattice defects may become unbalanced both in cases where the peak amplitude has a small value, which means the TO mode is high, and where the peak amplitude has a large value, which means the LO mode is high, resulting in impairing the function as a transparent electroconductive oxide.

A Raman spectrum peak is easily calculated by fitting a measured spectrum with a combination with a number of peaks using Gaussian functions. In a case of film formation on an alkali-free glass substrate, for example, a peak derived from the glass substrate is detected in the vicinity of 490 cm$^{-1}$, so that the peak ratio is calculated by fitting a combination of three Gaussian functions to the measured spectrum.

In the present invention, a hydrogen plasma treatment may be carried out on the substrate having the transparent electrode after the film formation of the transparent electroconductive oxide layer 2 so as to increase electroconductivity. The hydrogen plasma treatment generates oxygen defects, largely contributing to electroconductivity of a zinc oxide transparent electroconductive oxide, thereby improving electroconductivity. A favorable substrate having a transparent electrode is produced by the hydrogen plasma treatment by flowing hydrogen at a pressure of about 50 to 200 Pa and discharging an electrical current at 0.02 W/cm$^2$ to 3.00 W/cm$^2$ using a RF power source. In the hydrogen plasma treatment, too low of a power is not effective and a too high of a power causes etching of the transparent electroconductive oxide, which is undesirable.

A substrate having a transparent electrode deposited on a glass substrate or a soft material having a high softening (melting) temperature may be exposed to an annealing treatment so as to improve electroconductivity and light transmittance. The annealing treatment is preferably carried out in vacuum or at an atmosphere under a flow of an inert gas, such as nitrogen. The annealing treatment in an oxygen atmosphere is undesirable due to reduced electroconductivity caused by thermal oxidation of the transparent electroconductive oxide. The annealing treatment is preferably carried out above a temperature at which crystallinity of zinc oxide is healed and below a melting temperature of the substrate. More specifically, an annealing treatment carried out at about 200 to 450 degrees centigrade results in a good substrate having a transparent electrode.

The transparent electroconductive layer 2 preferably has a film thickness of 15 to 500 nm and more preferably that of 20 to 200 nm. The oxide layer having a film thickness within such a range generates a highly transparent and electroconductive substrate having a transparent electrode. A thinner film is undesirable because in the film formation by the magnetron sputtering method, the transparent electroconductive oxide may experience striped growth, and thus may not function as a film. Further, a thicker film is also undesirable because such an oxide layer decreases transmittance because of excess absorption of light by the oxide and is vulnerable to stress-induced cracking.

A method of detecting an amount of doping contained in the oxide layer 2 may be any method so long as it is generally used for elemental analysis. For example, the method may include an elemental analysis method such as atomic absorption analysis and fluorescent X-ray analysis; a spectroscopic analytical method such as X-ray photoelectron spectroscopy, Auger electron spectroscopy, and electron-beam microanalyzer; and secondary ion mass spectroscopy.

Among these methods, energy dispersive X-ray fluorescent analysis (EDX) carries out a highly accurate elemental analysis simultaneously with a shape observation using a scanning electron microscope (SEM) or a transmission electron microscope (TEM), and is a relatively simple method.

According to these methods, a doping amount relative to zinc is readily calculated by the following formula:

(Doping amount)=(Number of atoms of Doping substance)÷((Number of atoms of Doping substance)+(Number of atoms of Zinc))×100

A sheet resistance of a surface of a substrate for a transparent electrode is, depending on the intended use, preferably about 10 to 20 Ω/square for purposes such as a solar cell and an EL element and about 200 to 2000 Ω/square for purposes such as a touch panel.

For improvement of light transmittance, the substrate having the transparent electrode in the present invention may be provided with an optical design layer, either between the substrate 1 and the oxide layer 2 or on the surface of the oxide layer 2. Specifically, between the substrate 1 and the oxide layer 2, a high refractive index layer, such as titanium oxide, hafnium oxide, and niobium oxide, and a low refractive index layer, such as silicon dioxide, are laminated in such a manner as: the substrate 1/a high refractive index layer/a low refractive index layer/the oxide layer 2, thereby inhibiting light reflection at an interface from the substrate to the oxide layer and improving light transmittance.

In provision of the optical design layer on the oxide layer 2, lamination of a lower refractive index layer relative to that of the transparent electroconductive oxide layer more strongly inhibits light reflection. Specifically, a mixture such as poly (3,4-ethylenedioxythiophene) (PEDOT) and polystyrene sulfonate (PSS) is appropriate. Furthermore, a material such as electroconductive porous carbon can be used.

(An Oxide Layer Added with Gallium Oxide, Aluminum Oxide, or Boron Oxide)

A zinc oxide electroconductive oxide layer is exposed to doping for provision of electroconductivity and improvement of durability. The doping is carried out using at least one doping substance selected from a group consisting of gallium, aluminum, and boron. These substances are doped in zinc oxide as oxides, such as gallium oxide, aluminum oxide, and boron oxide. A doping amount is preferably 1.0 to 4.0% of each element by weight relative to zinc. Electroconductivity tends to be reduced if the substance is doped too much or too little, because too much dopant causes segregation of a dopant oxide in the vicinity of a crystal grain boundary, leading to grain boundary scattering of carriers contributing to electroconductivity, and too little dopant reduces carriers contributing to electroconductivity, thus preventing electro conductivity.

One of the main points of the present invention is that the transparent electroconductive oxide layer 2 has, for the LO (longitudinal optical) mode to the TO (transverse optical) mode, a peak amplitude ratio ($I_{LO}/I_{TO}$) of 1.40 to 2.20, both modes being A1-symmetrical optical vibration modes, in the Raman spectrum measurement of layer 2. The Raman spectrum measurement is carried out using a helium-neon laser beam having a wavelength of 632.8 nm. Zinc oxide has peak positions detected in the ranges of 570 to 575 cm$^{-1}$ and 380 to 385 cm$^{-1}$, respectively, in response to vibrations of A1-symmetrical LO and TO modes. Herein, the peak positions may shift in response to an added dopant amount.

Generally, these peaks of the Raman spectrum selectively appear in accordance with crystal properties, and thus a crystal structure of a transparent electroconductive oxide layer is determined by analysis of the peak amplitude ratio. It is assumed that the LO and TO modes are related to a growth direction of a film and crystalline orientation. The present inventors found that a peak amplitude ratio of 1.40 to 2.20 for LO/TO indicates a substrate having a transparent electrode that has an excellent durability in high temperature and high humidity environments. If the ratio is larger or smaller than this range, the substrate has insufficient stability. This is attributed to the fact that a mixing ratio of zinc oxide having different crystal properties has an optimum value and disruption of its balance reduces stability in a high temperature and high humidity environment.

Another of the main points of the present invention is that the substrate satisfies, simultaneously, the following two formulae relating to data obtained by observing the surface of the oxide layer 2 with an atom force microscope (AFM) and analyzing the result with Sa (nm), representing Surface Average Roughness; Sds ($\mu m^{-2}$), representing Density of Summits of the Surface; and D (nm), representing a film thickness of the oxide layer:

$$Sa \leq 0.01 \times D + 4.0$$

$$Sds \geq -0.55 \times D + 420$$

A crystalline compound tends to have increasing surface roughness as the film becomes thicker because a diameter of a crystal grain in the layer becomes larger. The present inventors found that the surface roughness, satisfying the above-mentioned first formula, improves stability in a high temperature and high humidity environment. It is assumed that this is because the reduced roughness minimizes the surface area of the oxide layer, thereby reducing the area exposed to water and/or oxygen.

Further, it has been found that the Density of Summits of the Surface satisfying the above-mentioned second formula improves stability in a high temperature and high humidity environment. This is explained as follows: Sds is taken as the number of crystal grains per unit area and thus, the larger the Sds, the greater the number of crystal grains and the greater the crystal density. As a consequence, it is assumed that the crystal grain boundary has a dense structure, which prevents seeping and attaching of water and/or oxygen.

Film formation of the transparent electroconductive oxide layer 2 is performed by the magnetron sputtering method. Specifically, the oxide layers in the present embodiments are formed at a power density of 3.5 to 18 W/cm$^2$, and more preferably at a power density of 6.0 to 11.0 W/cm$^2$ to increase sputtering.

Too great of a power density is not desirable because it causes target damage and damage to the oxide layer deposited on the base resulting from ion species in plasma reaching the substrate. A power density within the above-mentioned range forms the transparent electroconductive oxide layer having properties such as the above-mentioned Raman spectrum ratios and surface roughnesses. It is assumed that this is because atoms or ion species reaching the base attach densely and finely by increasing ion collision energy with the target and making sizes of the atoms or the ion species leaving from the target smaller.

Further, the results of the Raman spectrum measurement estimate that the crystalline orientation depends on the power density in the film formation, and thus, these results determine the performance of the transparent electroconductive oxide layer. During film formation, in the present embodiment, the optimum condition is determined by appropriately controlling the target/substrate distance and/or the temperature of the substrate so as to reduce damage to the substrate.

The transparent electroconductive oxide layer 2 in the present embodiment may also be exposed to the hydrogen plasma treatment or the annealing treatment to further improve electroconductivity. These treatments have the effect of enlarging the grain diameter by removal of interstitial atoms and/or causing solid-phase reactions between crystals, thereby leading to improvement of electroconductivity. The hydrogen plasma treatment is carried out by flowing hydrogen at a pressure of about 50 to 200 Pa and discharging an electrical current at a power density of 0.02 to 3.00 W/cm$^2$ by a RF power source, thereby producing a favorable substrate having a transparent electrode. In this treatment, too low of a power cannot be very effective and too high of a power causes etching of a transparent electroconductive oxide, which is undesirable. The annealing treatment is preferably carried out in vacuum or in a nitrogen atmosphere. The treatment in an oxygen atmosphere is undesirable due to reduced electroconductivity caused by thermal oxidation of the transparent electroconductive oxide. The annealing treatment may be carried out at about 150 to 450 degrees centigrade.

(Measurement Devices, etc.)

In the examples described below, the doping amount measurement was performed with a scanning electron microscope including an EDX measuring function, JSM-6390-LA manufactured by Nihon Denshi (JEOL Ltd.). The doping amount was calculated as a ratio of silicon dioxide (molecular weight 60 g/mol) and zinc oxide (molecular weight 81 g/mol), after converting a ratio of detected amounts of elements of silicon and zinc regarded as the numbers of atoms to a ratio of amounts of substances (mole ratio). The film thickness of the transparent electroconductive oxide layer was obtained by a spectroscopic ellipsometer VASE manufactured by J. A. Woollam Co., Inc. A Cauchy model was used for fitting. A laser Raman spectrometry was carried out using Laser Raman spectrometer NR1000 manufactured by Nihon Bunko Industry (JASCO Co.).

The measurement was taken using helium-neon laser beam having an excitation wavelength of 632.8 nm. In a range of 300 cm$^{-1}$ to 650 cm$^{-1}$ of the spectrum obtained by the measurement, three peaks consisting of two peaks respectively for the LO mode and the TO mode, and a peak for the glass, were respectively expressed as Gauss functions. Combinations of the three Gauss functions were fitted. The fitting was taken using three elements consisting of a peak height, a half bandwidth, and a peak frequency as variables.

(Reliability Test)

In any substrate having a transparent electrode, results of reliability tests were shown as a ratio (R1/R0) of sheet resistances of the surfaces of the substrates, the sheet resistance (R0), which is a reference, being immediately after the substrate was formed and the sheet resistance (R1) being after the substrate was left under 85 degrees centigrade and 85% relative humidity for 10 days. The sheet resistance was measured using a resistivity measurement device, Loresta Model GP MCT-610 manufactured by Mitsubishi Kagaku Co., Ltd.

The reliability tests were evaluated as follows. After measurement of a sheet resistance of the surface of the substrate having the transparent electrode immediately after formation of the film, the substrate was placed in a constant temperature and humidity testing machine set at 85 degrees centigrade/ 85% RH. After being left for 10 days, the substrate was taken out from the machine and was left so as to be cooled down to a room temperature, and thereafter a sheet resistance of the surface was measured. The results were evaluated in the following formula:

(Reliability test result)=(Sheet resistance after 10 days)÷(Sheet resistance immediately after film formation)

Values of the reliability test results express quality stability relating to stability against environmental variability of a substrate having a transparent electrode. These values are within a range of 0.50 to 2.0 most widely, 0.75 to 1.50 preferably, 0.75 to 1.40 more preferably, and 0.8 to 1.2 most preferably. A value larger or smaller than this range causes resistive instability, possibly leading to degradation of pictures in a display material, reduction of conversion efficiency in a material for a solar cell and the like, and reduction of the accuracy in a material for a touch panel and the like.

EXAMPLES

Now, various examples are described below relating to the above-mentioned embodiments of the present invention, but the present invention is not limited thereto.

Examples 1~2, and Comparative Example 1

A transparent electroconductive oxide layer was deposited on an alkali-free glass base (product name: OA-10, manufactured by Nippon Electric Glass Co., Ltd., a film thickness of 0.7 mm) by a magnetron sputter film-forming method. Films were formed respectively using zinc oxide added with 1.0% silicon dioxide by weight (Example 1), zinc oxide added with 2.0% silicon dioxide by weight (Example 2), and zinc oxide without silicon dioxide as sputtering targets and flowing argon gas of 20 cubic cm per minute as calculated in terms of standard state under a pressure of 0.2 Pa and at a power density of 8 W/cm$^2$, so as to give film thicknesses of 50 nm (Comparative Example 1). A high frequency power source (frequency: 13.56 MH$_Z$) was used as a power source. The method was carried out using a target with a diameter of four inches (101.6 mm) at a target-substrate distance of 80 mm and a temperature of the substrate at 80 degrees centigrade. The produced substrates underwent reliability tests after measurements of the film thicknesses, transmittance values, and sheet resistances. As results of composition analysis by EDX measurement, the produced transparent electrodes contained 1.0% silicon dioxide (Example 1) by weight and 2.0% silicon dioxide by weight (Example 2), respectively.

Example 3

A substrate having a transparent electrode was produced in the same manner as that in Example 1 except having a sputtering power density of 4 W/cm$^2$, and was evaluated.

Example 4

A substrate having a transparent electrode was produced in the same manner as that in Example 2 except having a sputtering power density of 12 W/cm$^2$, and was evaluated.

Example 5

A substrate having a transparent electrode was produced in the same manner as that in Example 2 except having a sputtering power density of 4 W/cm$^2$, and was evaluated.

Comparative Example 2

A substrate having a transparent electrode was produced in the same manner as that in Example 1 except having a sputtering power density of 2 W/cm$^2$, and was evaluated.

Figure 2:
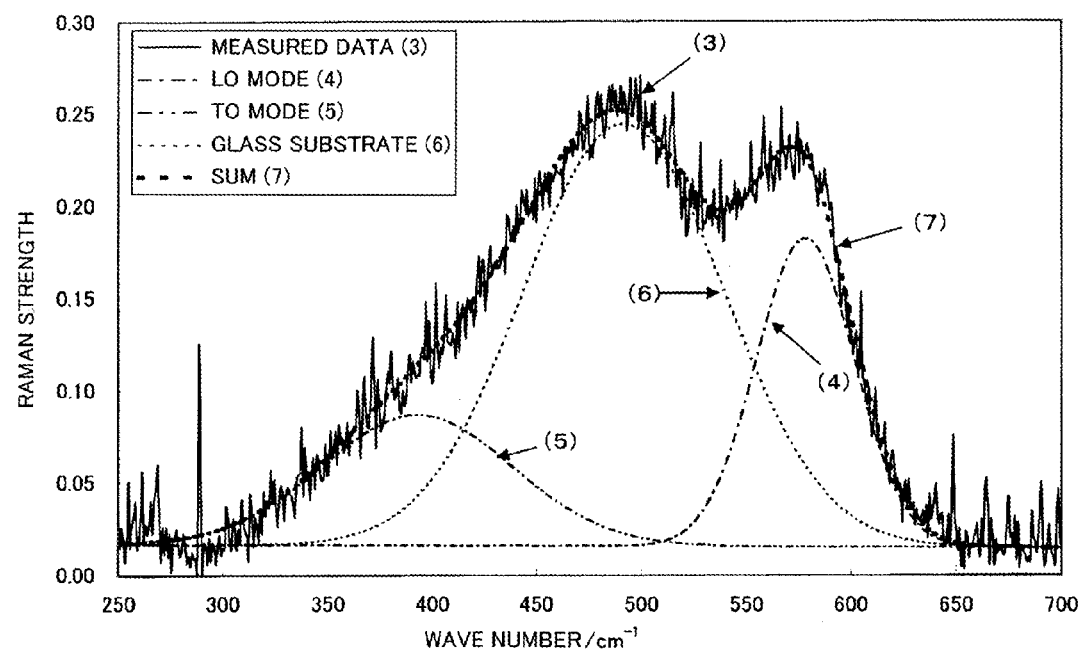
FIG. 2 is a view showing Raman spectra of a substrate having a transparent electrode (Example 1) of the present invention.
Figure 3:
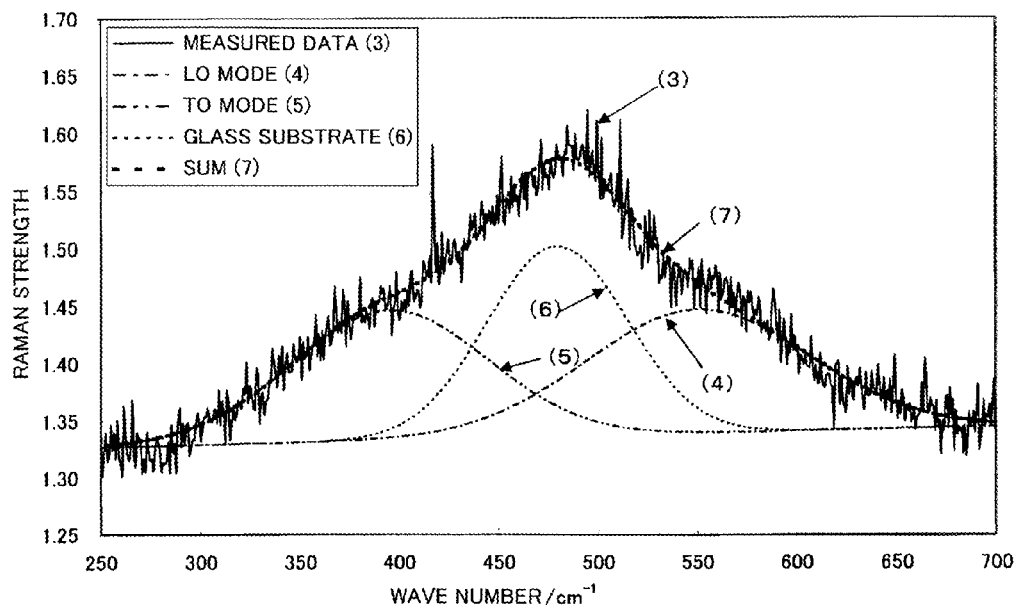
FIG. 3 is a view showing Raman spectra of another substrate having a transparent electrode (Example 2) of the present invention.
Figure 4:
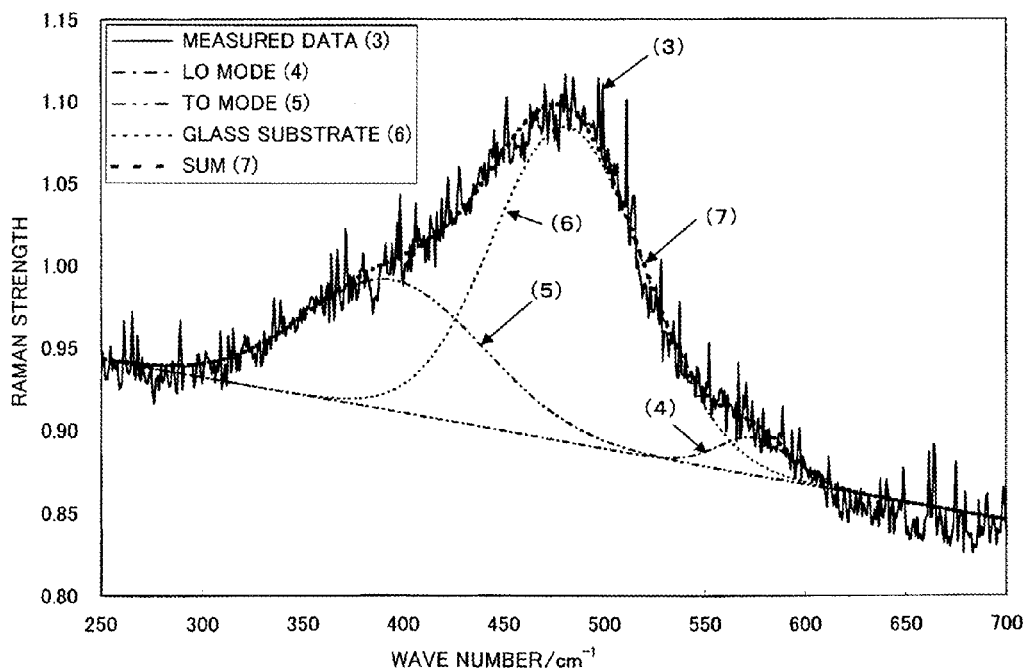
FIG. 4 is a view of Raman spectra of still another substrate having a transparent electrode (Comparative Example 2) relating to the present invention.

Raman spectra of Examples 1 and 2 and Comparative Example 2 are shown in FIGS. 2-4. In each figure, a horizontal axis represents a wave number (cm$^{-1}$) and a vertical axis represents Raman strength. In these figures, graphs indicated by the reference number (3) show measured data and graphs indicated by the reference numbers (4), (5), and (6) show the peaks derived from the TO mode, LO mode, and the glass substrate, respectively. Graphs indicated by the reference number (7) are obtained by summing the graphs (4), (5), and (6), corresponding to smoothing of the graphs (3). By comparisons of the graphs (4) (LO mode) with the graphs (5) (TO mode), it is revealed that the Examples 1 and 2 have higher peaks in the graphs (4) (LO mode) and the larger $I_{LO}/I_{TO}$ ratios than those in the Comparative Example 2.

The result of study of the above-mentioned Examples and Comparative Examples is shown in a Table 1, below. Further, the power densities, the $I_{LO}/I_{TO}$ ratios, and rates of change of sheet resistances under high temperature and humidity environment of the Examples and the comparative Examples are shown in a Table 2, below.

TABLE 1

| | SiO$_2$ content (%/wt.) | Film thickness (nm) | Sheet resistance (Ω/Sq.) | | |
|---|---|---|---|---|---|
| | | | Before test | After test | Rate of change |
| Example 1 | 1.0 | 50 | 800 | 900 | 1.1 |
| Example 2 | 2.0 | 50 | 1000 | 1010 | 1.0 |
| Example 3 | 1.0 | 50 | 600 | 800 | 1.3 |
| Example 4 | 2.0 | 50 | 900 | 900 | 1.0 |
| Example 5 | 2.0 | 50 | 800 | 1040 | 1.3 |
| Comparative Example 1 | 0 | 50 | 1500 | 9400 | 6.3 |
| Comparative Example 2 | 1.0 | 50 | 550 | 1760 | 3.2 |

TABLE 2

| | Film-forming power density (W/cm$^2$) | $I_{LO}/I_{TO}$ ratio | Rate of change of sheet resistance. |
|---|---|---|---|
| Example 1 | 8 | 0.96 | 1.1 |
| Example 2 | 8 | 1.00 | 1.0 |
| Example 3 | 4 | 0.76 | 1.3 |
| Example 4 | 12 | 1.54 | 1.0 |
| Example 5 | 4 | 0.50 | 1.3 |
| Comparative Example 1 | 8 | 0.48 | 6.3 |
| Comparative Example 2 | 2 | 0.21 | 3.2 |

Examples 1-5 each obtained good sheet resistances and good rates of change thereof. Comparative Example 1 (without silicon dioxide) had too large of a sheet resistance and a rate of change thereof. Comparative Example 2 (too low of a power density and $I_{LO}/I_{TO}$ ratio) had too large of a rate of change thereof. These results revealed that a substrate having a transparent electrode that is formed by the magnetron sputtering method using a target containing zinc oxide added with silicon dioxide and at a power density in an appropriate range improves reliability in a high temperature and high humidity environment compared to a substrate having a transparent electrode using only zinc oxide, and that this is linked with the Raman spectrum.

Examples 6 to 10, Comparative Examples 3 to 5

In each example, 2.0% gallium oxide by weight added with zinc oxide (GZO) was deposited on an alkali-free glass base (product name: OA-10, manufactured by Nippon Electric Glass Co., Ltd., a film thickness of 0.7 mm) by a magnetron sputter film-forming method. The resulting films had film thicknesses of 30 nm in Example 10, and of 45 nm in Examples 6-9 and Comparative Examples 3-5.

Film-forming conditions, which are similar to those in Examples 1-5, were as follows:
Target size: Diameter of 4 inches (101.6 mm)
Carrier gas and its pressure: Argon gas at 0.2 Pa
Power source: High frequency (13.56 $MH_Z$) power source
Target-substrate Distance: 80 mm
Temperature of substrate: 80 degrees centigrade
AFM (atomic force microscope) measurement was carried out using Nano-R, manufactured by Pacific Nanotechnology Inc. Other measuring devices used were the same as used in Examples 1-5: NR1000 Laser Raman spectrometer manufactured by Nihon Bunko Industry (JASCO Co.) for the laser Raman spectrometry, Loresta Model GP MCT-610 manufactured by Mitsubishi Kagaku Co., Ltd. for the sheet resistance measurement, and spectroscopic ellipsometer VASE manufactured by J. A. Woollam Co., Inc. for measurement of the film thickness. The fitting was carried out by a Cauchy model.

Example 6

A substrate having a transparent electrode was produced at a sputtering power density of 9.87 W/cm², and was evaluated.

Example 7

A substrate having a transparent electrode was produced in the same manner as Example 6, except having a sputtering power density of 8.64 W/cm², and was evaluated.

Example 8

A substrate having a transparent electrode was produced in the same manner as Example 6, except having a sputtering power density of 6.79 W/cm², and was evaluated.

Example 9

A substrate having a transparent electrode was produced in the same manner as Example 6, except having a sputtering power density of 6.20 W/cm², and was evaluated.

Example 10

A substrate having a transparent electrode was produced in the same manner as Example 9, except having a film thickness of 30 nm, and was evaluated.

Comparative Example 3

A substrate having a transparent electrode was produced in the same manner as Example 6, except having a sputtering power density of 4.94 W/cm², and was evaluated.

Comparative Example 4

A substrate having a transparent electrode was produced in the same manner as Example 6, except having a sputtering power density of 3.09 W/cm², and being was being evaluated.

Comparative Example 5

A substrate having a transparent electrode was produced in the same manner as Example 6, except having a sputtering power density of 1.23 W/cm², and was evaluated.

The results of Raman spectra, AFMs, and reliability tests of the substrates produced in Examples 6-10 and Comparative Example 3-5 are shown in Tables 3-5, respectively.

In Table 4, Sao (nm) represents a reference value of Surface Average Roughness calculated from the film thickness D (nm) with the formula: Sao=0.01×D+4.0. Sdso ($\mu m^{-2}$) represents a reference value of Density of Summits of the Surface calculated from the film thickness D (nm) with the formula: Sdso=−0.55×D+420. In Table 4, each of Examples 6-10 satisfy the formula: Sa≤Sao and Sds≥Sdso, and each of Comparative Examples 3-5 satisfy the formula: Sds<Sdso.

TABLE 3

| | Film-forming power density (W/cm²) | Raman spectrum | | |
|---|---|---|---|---|
| | | $I_{LO}$ | $I_{TO}$ | $I_{LO}/I_{TO}$ ratio |
| Example 6 | 9.87 | 0.014 | 0.008 | 1.75 |
| Example 7 | 8.64 | 0.016 | 0.008 | 2.00 |
| Example 8 | 6.79 | 0.017 | 0.011 | 1.55 |
| Example 9 | 6.20 | 0.014 | 0.009 | 1.56 |
| Example 10 | 6.20 | 0.012 | 0.008 | 1.50 |
| Comparative Example 3 | 4.94 | 0.014 | 0.011 | 1.27 |
| Comparative Example 4 | 3.09 | 0.011 | 0.009 | 1.22 |
| Comparative Example 5 | 1.23 | 0.008 | 0.011 | 0.74 |

TABLE 4

| | AFM measurement | | | | Film thickness (nm) |
|---|---|---|---|---|---|
| | (Sa/nm) | (Sds/ $\mu m^{-2}$) | (Sao/nm) | (Sdso/ $\mu m^{-2}$) | |
| Example 6 | 1.10 | 447 | 4.45 | 395 | 45 |
| Example 7 | 0.97 | 431 | 4.45 | 395 | 45 |
| Example 8 | 1.35 | 400 | 4.45 | 395 | 45 |
| Example 9 | 1.52 | 400 | 4.45 | 395 | 45 |
| Example 10 | 3.50 | 420 | 4.30 | 403.5 | 30 |
| Comparative Example 3 | 1.85 | 269 | 4.45 | 395 | 45 |
| Comparative Example 4 | 1.89 | 256 | 4.45 | 395 | 45 |
| Comparative Example 5 | 1.89 | 207 | 4.45 | 395 | 45 |

TABLE 5

| | Sheet resistance (Ω/Sq.) | | |
|---|---|---|---|
| | Before test | After test | Rate of change |
| Example 6 | 1749 | 2043 | 1.2 |
| Example 7 | 1228 | 2143 | 1.7 |
| Example 8 | 1622 | 3082 | 1.9 |
| Example 9 | 1520 | 844 | 0.56 |
| Example 10 | 1839 | 3494 | 1.9 |
| Comparative Example 3 | 3439 | 50250 | 14.6 |
| Comparative Example 4 | 2447 | 94710 | 38.7 |
| Comparative Example 5 | 1019 | 237900 | 233.5 |

Examples 6-10 each obtained a good sheet resistance and a good rate of change thereof. Comparative Examples 3-5 were examples which had too low of a power density, too small of an $I_{LO}/I_{TO}$ ratio, or too small of an Sds, having rates of change of sheet resistances that were too large, indicating low stability in a high temperature and high humidity environment.

These results revealed that film formation by the magnetron sputtering method using a target containing GZO added with a substance, such as gallium oxide, and at a power density in an appropriate range, increases stability in a high temperature and high humidity environment and that this is linked with the Raman spectrum and the result of an AFM.

The invention claimed is:

1. A method for producing a substrate including a base and at least one transparent electroconductive oxide layer composed mainly of zinc oxide and formed on the base, wherein the at least one transparent electroconductive oxide layer is composed of a transparent electroconductive oxide containing 0.8 to 2.2% silicon dioxide by weight relative to zinc oxide and having a peak amplitude ratio $I_{LO}/I_{TO}$ of 0.40 or more, when $I_{LO}$ and $I_{TO}$ represent respectively peak amplitudes in a longitudinal optical mode and a transverse optical mode, both modes being A1-symmetrical optical vibration modes detected by a laser Raman spectrometry, the method comprising:

forming the transparent electroconductive oxide layer by a magnetron sputtering method using a mixture of zinc oxide and 0.8 to 2.2% silicon dioxide by weight relative to the zinc oxide as a sputtering target and applying a power density of 3.5 W/cm$^2$ or more to the target in a sputtering film formation.

2. The method as defined in claim 1,
wherein the magnetron sputtering method includes applying a power density of 18 W/cm$^2$ or less to the target in the sputtering film formation.

3. A method for producing a substrate having a transparent electrode including a base, a transparent electroconductive oxide layer composed mainly of zinc oxide and formed on the base, wherein the transparent electroconductive oxide layer is composed of a mixed oxide comprising zinc oxide and at least one oxide selected from the group consisting of gallium oxide, aluminum oxide, and boron oxide, and having a peak amplitude ratio $I_{LO}/I_{TO}$ of 1.40 or more, when $I_{LO}$ and $I_{TO}$ represent respectively peak amplitudes in a longitudinal optical mode and a transverse optical mode, both modes being A1-symmetrical optical vibration modes detected by a laser Raman spectrometry, the method comprising:

forming the transparent electroconductive oxide layer by a magnetron sputtering method using a mixed oxide of zinc oxide and at least one oxide selected from the group consisting of gallium oxide, aluminum oxide, and boron oxide as a sputtering target and applying a power density of 6.0 W/cm$^2$ or more to the target in a sputtering film formation.

4. The method as defined in claim 3,
wherein the magnetron sputtering method includes applying a power density of 18 W/cm$^2$ or less to the target in the sputtering film formation.

5. A method for producing a substrate having a transparent electrode including a base and a transparent electroconductive oxide layer composed mainly of zinc oxide and formed on the base, wherein the transparent electroconductive oxide layer is composed of a mixed oxide comprising zinc oxide and at least one oxide selected from the group consisting of gallium oxide, aluminum oxide, and boron oxide, and the substrate satisfying the following two formulae with D (nm) representing a film thickness of the transparent electroconductive oxide layer, Sa (nm) representing Surface Average Roughness measured with an atomic force microscope, and Sds (μm$^{-2}$) representing Density of Summits of the Surface: Sa≤0.01×D+4.0, Sds≥−0.55×D+420, the method comprising:

forming the transparent electroconductive oxide layer by a magnetron sputtering method using a mixed oxide of zinc oxide and at least one oxide selected from the group consisting of gallium oxide, aluminum oxide, and boron oxide as a sputtering target and applying a power density of 6.0 W/cm$^2$ or more to the target in a sputtering film formation.

6. The method as defined in claim 5,
wherein the magnetron sputtering method includes applying a power density of 18 W/cm$^2$ or less to the target in the sputtering film formation.

7. A method for producing
a substrate having a transparent electrode including a base, and at least one transparent electroconductive oxide layer composed mainly of zinc oxide and formed on the base, wherein the at least one transparent electroconductive oxide layer is composed of a transparent electroconductive oxide containing 0.8 to 2.2% silicon dioxide by weight relative to zinc oxide, the substrate further having a surface, wherein the surface has a first sheet resistance immediately after the substrate is formed and a second sheet resistance after the substrate is left at 85 degrees centigrade and 85% relative humidity for 10 days, a ratio of the second sheet resistance to the first sheet resistance being 0.75 to 1.5, the method comprising:

forming the transparent electroconductive oxide layer by a magnetron sputtering method using a mixture of zinc oxide and 0.8 to 2.2% silicon dioxide by weight relative to the zinc oxide as a sputtering target and applying a power density of 3.5 W/cm$^2$ or more to the target in a sputtering film formation.

8. The method as defined in claim 7,
wherein the magnetron sputtering method includes applying a power density of 18 W/cm$^2$ or less to the target in the sputtering film formation.

* * * * *